(12) United States Patent
Lee

(10) Patent No.: US 8,643,041 B2
(45) Date of Patent: Feb. 4, 2014

(54) LIGHT EMITTING DEVICE PACKAGE

(75) Inventor: Gun Kyo Lee, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 200 days.

(21) Appl. No.: 13/106,021

(22) Filed: May 12, 2011

(65) Prior Publication Data

US 2011/0278617 A1    Nov. 17, 2011

(30) Foreign Application Priority Data

May 12, 2010 (KR) .................. 10-2010-0044603

(51) Int. Cl.
*H01L 33/58*    (2010.01)

(52) U.S. Cl.
USPC ............ 257/98; 257/79; 257/100; 257/103; 257/E33.059; 257/E33.068

(58) Field of Classification Search
USPC ......... 257/13, 79–103, 918, E51.018–51.022, 257/E33.001–33.077, E33.054, E25.028, 257/E25.032
See application file for complete search history.

(56) References Cited

U.S. PATENT DOCUMENTS

| | | | |
|---|---|---|---|
| 2010/0045181 A1* | 2/2010 | Oh et al. .................... | 313/512 |
| 2010/0207521 A1* | 8/2010 | Tamaki et al. ............... | 313/506 |
| 2011/0053297 A1* | 3/2011 | Andrews ..................... | 438/26 |
| 2011/0309406 A1* | 12/2011 | Inoguchi ..................... | 257/99 |
| 2011/0311831 A1* | 12/2011 | Suzuki et al. ................ | 428/457 |
| 2012/0025167 A1* | 2/2012 | Chu et al. .................... | 257/14 |
| 2012/0025243 A1* | 2/2012 | Lin ............................. | 257/98 |
| 2012/0061702 A1* | 3/2012 | Andrews et al. ............. | 257/98 |
| 2012/0276667 A1* | 11/2012 | Lin ............................. | 438/26 |

* cited by examiner

*Primary Examiner* — Mamadou Diallo
(74) *Attorney, Agent, or Firm* — KED & Associates LLP

(57) ABSTRACT

A light emitting device package is provided comprising a substrate, a light source unit disposed on the substrate and a dam unit spaced apart from the light source unit and disposed on the substrate, wherein the dam unit including silicon resin and metal oxide, and the metal oxide is contained in an amount of 5 wt % to 150 wt % based on a total amount of the silicon resin.

17 Claims, 10 Drawing Sheets

LIGHT EMITTING DEVICE PACKAGE

CROSS-REFERENCE TO RELATED APPLICATION

This application claims the priority benefit of Korean Patent Application No. 10-2010-0044603, filed on May 12, 2010 in the Korean Intellectual Property Office, the disclosure of which is incorporated herein by reference.

BACKGROUND OF THE EMBODIMENT

1. Technical Field

Embodiments are directed to a light emitting device package and more specifically to a light emitting device package in which a dam unit for configuring dual dome molding is formed.

2. Discussion of the Related Art

A light emitting diode converts an electrical signal into infrared rays, a visible ray, or light using the characteristic of a compound semiconductor, and it is being used in electric home appliances, remote controllers, electric bulletin boards, indicators, and various automation devices. The use area of the light emitting diode is gradually widened.

A small-sized light emitting diode is formed in a Surface Mount Device (SMD) type in order to have a Printed Circuit Board (PCB) directly mounted thereon. Accordingly, an light emitting diode lamp used as a display device is also being developed as the SMD type. The SMD can replace the existing simple lighting lamp, and it is used for a lighting indicator, a character indicator, and an image indicator which produce various colors.

With the use area of the light emitting diode being widened as described above, luminance necessary for electric lights for life and rescue signals is increasing. Accordingly, it is important to improve the emission luminance of the light emitting diode.

SUMMARY OF THE EMBODIMENT

Embodiments provide a light emitting device package having improved light extraction efficiency.

According to an embodiment, there is provided a light emitting device package comprising a substrate, a light source unit disposed on the substrate and a dam unit spaced apart from the light source unit and disposed on the substrate, wherein the dam unit including silicon resin and metal oxide, and the metal oxide is contained in an amount of 5 wt % to 150 wt % based on a total amount of the silicon resin.

According to an embodiment, there is provided a lighting system comprising a light emitting device package including a substrate, a light source unit disposed on the substrate and a dam unit spaced apart from the light source unit and disposed on the substrate and a power control module to which the light emitting device package supply power, wherein the dam unit including silicon resin and metal oxide, and the metal oxide is contained in an amount of 5 wt % to 150 wt % based on a total amount of the silicon resin.

According to the embodiments, since the dam unit includes metal oxide, light extraction efficiency of the light emitting device package can be improved.

DETAILED DESCRIPTION OF THE EXEMPLARY EMBODIMENTS

Figure 1A:
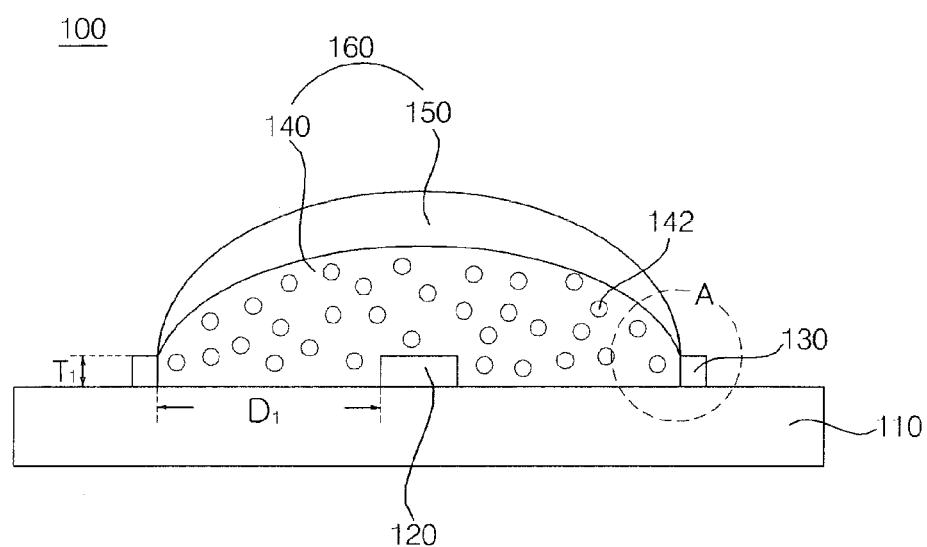
FIG. 1A is a cross sectional view illustrating a light emitting device package according to an embodiment.

Hereinafter, exemplary embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of LED array structures, which are not clearly described herein, are based on those shown in the drawings.

Figure 1B:
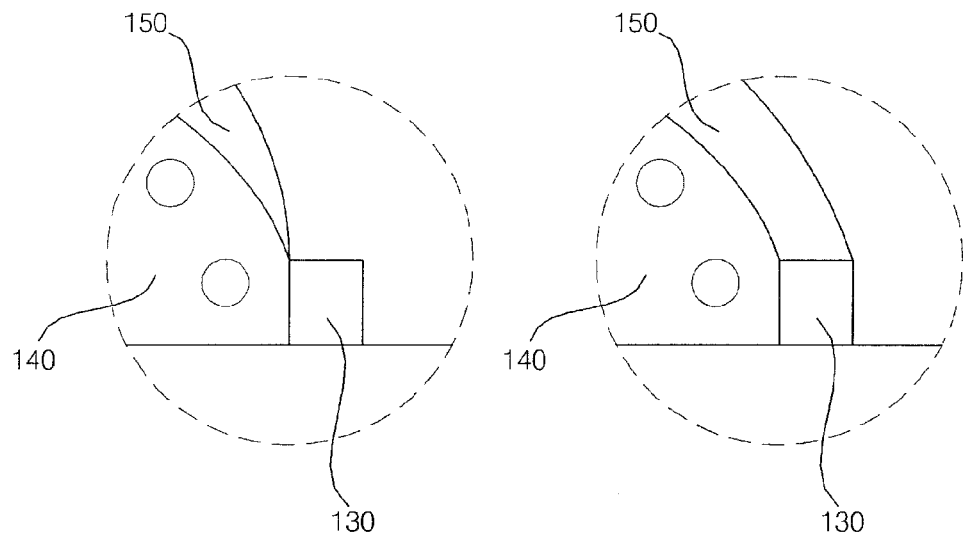
FIG. 1B is an enlarged view showing the portion A of the light emitting device package of FIG. 1A.

FIG. 1A is a cross sectional view illustrating a light emitting device package according to an embodiment, and FIG. 1B is an enlarged view showing the portion A of the light emitting device package of FIG. 1A.

Referring to FIG. 1, a light emitting device package 100 may includes a substrate 110, a light source unit 120 disposed on the substrate 110, and a dam unit 130 spaced apart from the light source unit 120 and disposed on the substrate 110.

The substrate 110 may be a flat substrate made of one of a ceramic material, a synthetic resin material, and a PCB. Electrodes (not shown) may be disposed on the substrate 110.

The electrodes (not shown) may be made of one or more metallic materials, such as titanium (Ti), copper (Cu), nickel (Ni), gold (Au), chromium (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), and iron (Fe) or an alloy of them.

Furthermore, the electrodes (not shown) may have a single layer structure or a multi-layer structure, but not limited thereto.

The light source unit 120 is disposed on the substrate 110, electrically connected to the electrodes (not shown) and configured to generate light using a power source provided through the electrodes.

The light source unit 120 may be, for example, a light emitting device. The light emitting device may be a colored the light emitting device that emits light, such as red light, green light, blue light, and white light, or an ultraviolet (UV) that emits ultraviolet rays, but not limited thereto.

The light emitting device may be applied to a horizontal type light emitting device chip in which all the electrical terminals are disposed on the upper side or a vertical type light emitting device chip in which all the electrical terminals are disposed on the upper and lower sides.

The dam unit 130 is spaced from the light source unit 120 at a specific interval and disposed to surround the circumference of the light source unit 120.

The dam unit 130 may have a circular or polygonal shape, but not limited thereto.

The dam unit 130 may be disposed by dispensing or screen-printing resin, including metal oxide, on the substrate 110.

The resin forming the dam unit 130 may be silicon resin. The dam unit 130 may be disposed to have steps as shown in FIGS. 2A to 2D.

The dam unit 130 may include the metal oxide in order to reflect light generated by the light source unit 120. The metal oxide may be, for example, titanium dioxide ($TiO_2$).

In the case where the dam unit 130 is disposed by dispensing or screen-printing silicon resin including titanium dioxide ($TiO_2$), titanium dioxide ($TiO_2$) may be contained in an amount of 5 wt % to 150 wt % based on the total weight of the silicon resin.

If titanium dioxide ($TiO_2$) is contained in an amount of 5 wt % or higher, the dam unit 130 can reflect light generated by the light source unit 120. With an increase of the titanium dioxide ($TiO_2$) content, the reflectivity of the dam unit 130 is increased.

If titanium dioxide ($TiO_2$) is contained in an amount of more than 150 wt %, the viscosity of the resin is excessively increased, thereby making it difficult to easily form the dam unit 130. Accordingly, titanium dioxide ($TiO_2$) preferably is contained in an amount of 5 to 150 wt % based on the total weight of the resin.

If the resin forming the dam unit 130 includes metal oxide, such as titanium dioxide ($TiO_2$), as described above, light extraction efficiency of the light-emitting element package 100 can be improved because the dam unit 130 can reflect light generated by the light source unit 120.

Referring back to FIG. 1A, the light emitting device package 100 may further include a dome molding unit 160 over the dam unit 130.

The light emitting device package 100 may be made of silicon or transparent resin, such as epoxy. When the dam unit 130 is disposed, the dome molding unit 160 may be easily disposed.

The dome molding unit 160 can improve extraction efficiency of light generated by the light source unit 120 because it has a dome shape.

According to Snell's Law, total reflection refers to a phenomenon in which when light travels from a material having a high refractive index to a material having a low refractive index, if the angle of incident light is greater than a critical angle, the refractive index is totally reflected from the interface of two different materials. The dome molding unit 160 can increase the size of the critical angle.

Since total reflection of light traveling from the dome molding unit 160 toward the outside can be reduced, light extraction efficiency of the light emitting device package 100 can be improved. Furthermore, the dome molding unit 160 can easily control the color of light because the dome shape of the dome molding unit 160 makes uniform the path along where light generated by the light source unit 120 travels.

The dome molding unit 160 may include a first dome molding unit 140 and a second dome molding unit 150 formed on the first dome molding unit 140. At least one of the first dome molding unit 140 and the second dome molding unit 150 may include fluorescent materials 142.

The fluorescent materials 142 are excited by a light having a first light emitted by the light source unit 120, thus being capable of generating a second light.

For example, in the case where the light source unit 120 is a blue light emitting device and the fluorescent materials 142 are yellow fluorescent materials, the yellow fluorescent materials are excited by a blue light, thus being capable of generating a yellow light. A blue light generated by the light source unit 120 and the yellow light, excited and generated by the blue light, are mixed in colors. Accordingly, the light emitting device package 100 can provide a white light.

The fluorescent materials 142 may be known fluorescent materials, such as YAGs, TAGs, sulfides, silicates, aluminates, nitrides, carbides, nitride silicates, borates, fluorides, and phosphates.

For example, in the case where the first dome molding unit 140 includes the fluorescent materials 142 as shown in FIG. 1A, the viscosity of the first dome molding unit 140 may be decreased. Accordingly, a spread phenomenon may occur when the first dome molding unit 140 is formed through low surface tension.

The first dome molding unit 140 may be easily disposed by forming the dam unit 130 for maintaining the shape of the first dome molding unit 140. The height $T_1$ of the dam unit 130 may be 30 to 300 μm.

If the height $T_1$ of the dam unit 130 is less than 30 μm, it may be difficult to maintain the shape of the first dome molding unit 140 that is coated and a color deviation may increase.

If the height $T_1$ of the dam unit 130 is more than 300 μm, the speed of light generated by the light source unit 120 may be decreased. Accordingly, the height $T_1$ of the dam unit 130 preferably is 30 to 300 μm.

The dam unit 130 may be spaced apart from the light source unit 120 at a specific interval. The distance $D_1$ between the light source unit 120 and the dam unit 130 may be in the range of 50 to 1000 μm.

If the distance $D_1$ between the light source unit 120 and the dam unit 130 is less than 50 μm, the speed of light generated by the light source unit 120 may be decreased. If the distance $D_1$ between the light source unit 120 and the dam unit 130 is more than 1000 μm, a color deviation may be increased.

The second dome molding unit 150 on the first dome molding unit 140 functions to protect the first dome molding unit 140. The second dome molding unit 150 may have a low refractive index than the first dome molding unit 140.

According to Snell's Law, if the second dome molding unit 150 has a lower refractive index than the first dome molding unit 140, total reflection can be prevented from being generated at the interface of the first dome molding unit 140 and the second dome molding unit 150.

The critical angle is great between materials having a small difference in the refractive index. In this case, if the second dome molding unit 150 is made to have a relatively small refractive index, the critical angle of light traveling from the second dome molding unit 150 to the outside can be increased.

Accordingly, light extraction efficiency of the light emitting device package 100 can be further improved.

Referring to FIG. 1B, in the case where the second dome molding unit 150 is formed over the dam unit 130, the second dome molding unit 150 may be formed inside the dam unit 130 or formed to cover the dam unit 130.

Although the second dome molding unit 150 is disposed to cover the dam unit 130, the second dome molding unit 150 may be disposed not to miss the dam unit 130 because of surface tension because it has a sufficiently high viscosity.

FIGS. 2A to 2D are enlarged views showing the portion A of FIG. 1A.

Referring to FIGS. 2A to 2D, the dam unit 130 may be disposed stepwise with steps and may have a lower height as it becomes distant from the light source unit 120.

Figure 2A:
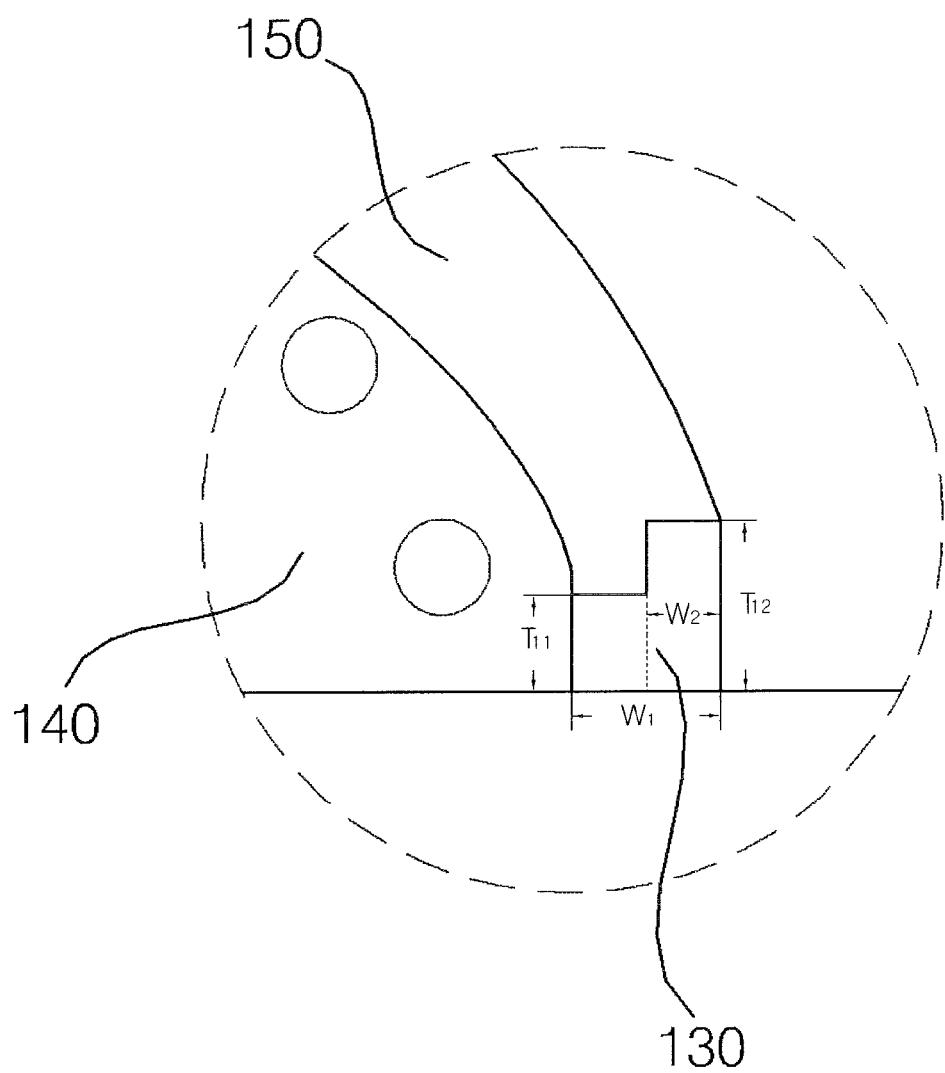
FIGS. 2A to 2D are enlarged views showing the portion A of FIG. 1A.

When the silicon resin including, for example, titanium dioxide ($TiO_2$) is dispensed or screen-printed in order to form the dam unit 130, the silicon resin may be first dispensed or screen-printed so that it has a width W1 and a height T11 and then dispensed or screen-printed so that it has a width W2 and a height T12, as can be seen from FIG. 2A.

Figure 2B:
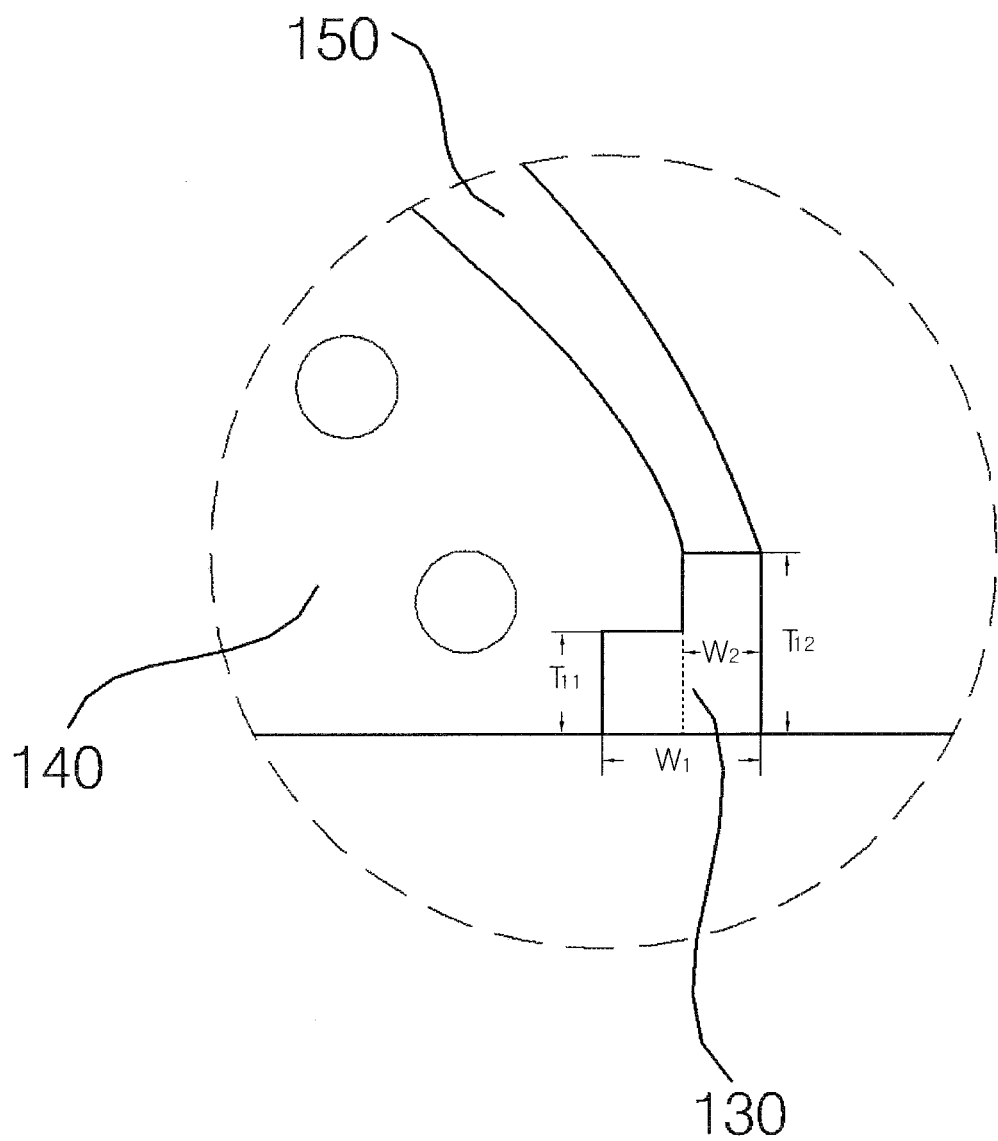

If the dam unit 130 is disposed stepwise as described above, although the first molding unit 140 is disposed over the dam unit 130 as shown in FIG. 2B, a spread phenomenon can be prevented by the steps and thus the shape of the first molding unit 140 can remain intact.

Figure 2C:
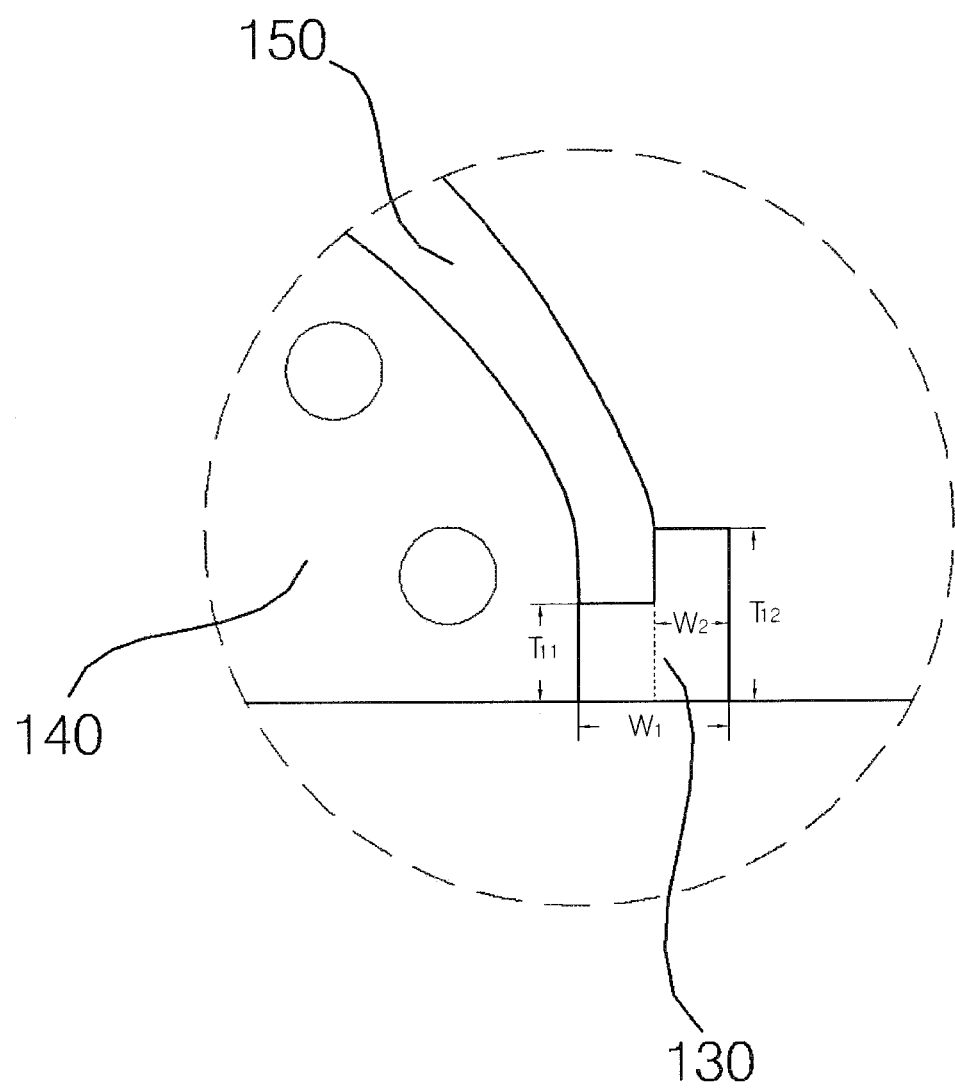
Figure 2D:
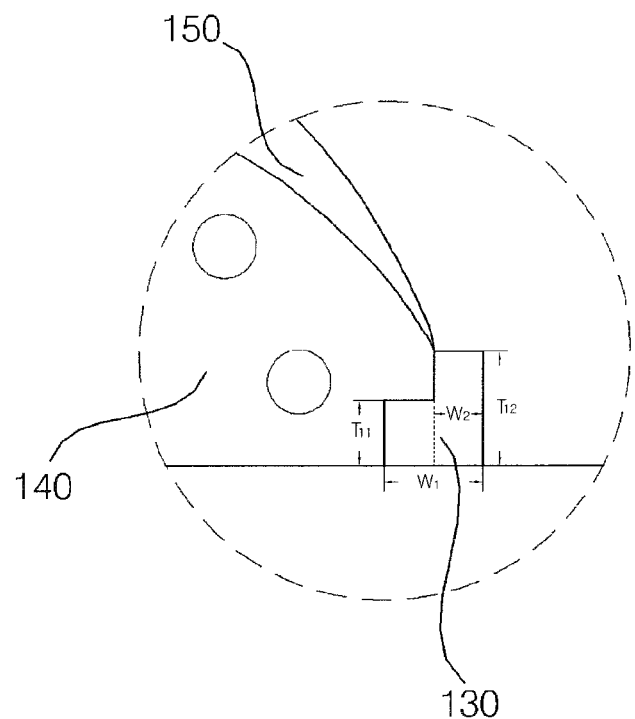

Alternatively, the second molding unit 150 may be disposed on the dam unit 130 having a width of W2, as shown in FIGS. 2C and 2D.

Figure 3:
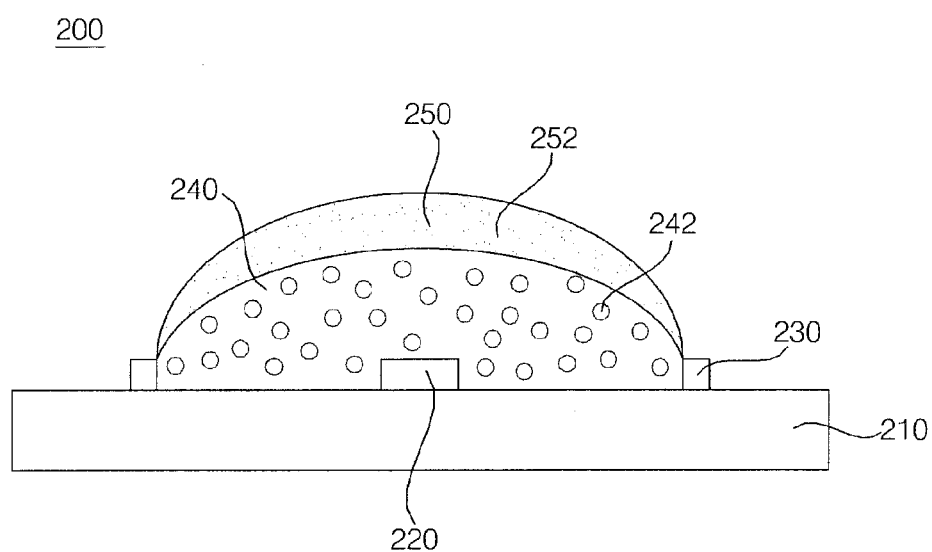
FIGS. 3 to 5 are a cross sectional view illustrating a light emitting device package according to embodiments.
Figure 4:
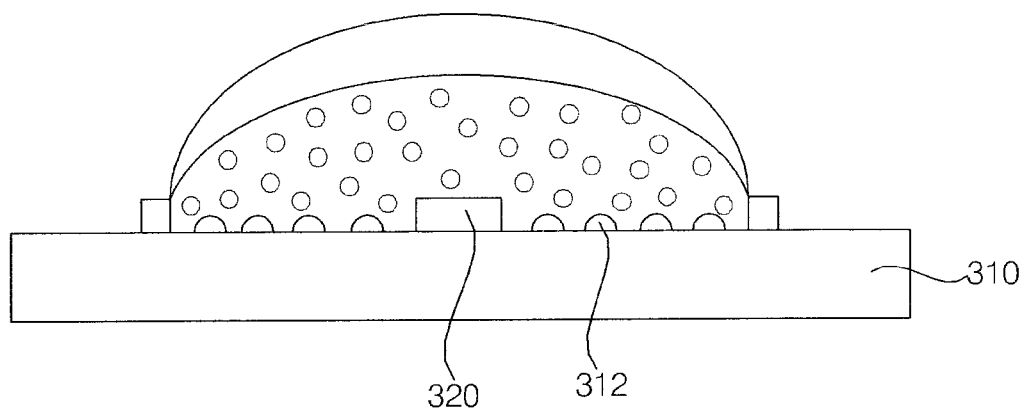
Figure 5:
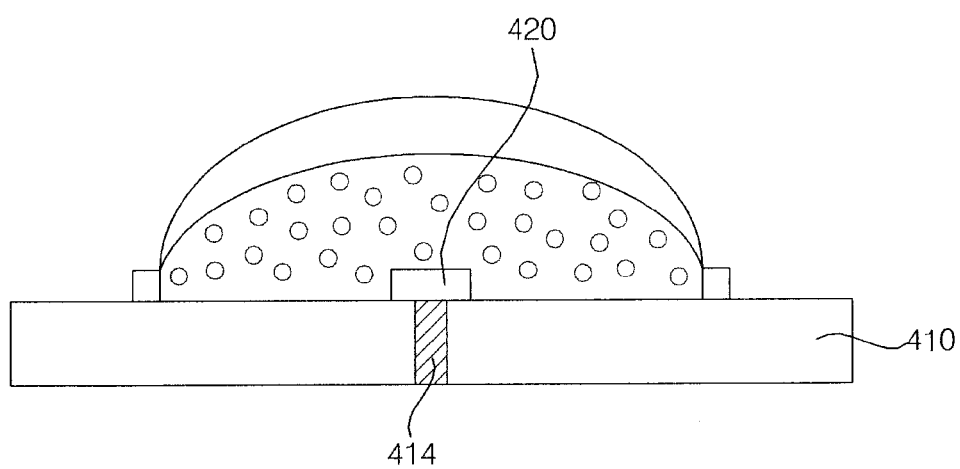

FIGS. 3 to 5 are a cross sectional view illustrating a light emitting device package according to embodiments.

Referring to FIG. 3, the light emitting device package 200 may include a substrate 210, a light source unit 220 disposed on the substrate 210, a dam unit 230 spaced apart from the light source unit 220, and a first dome molding unit 240 and a second dome molding unit 250 disposed over the dam unit 230. At least one of the first dome molding unit 240 and the second dome molding unit 250 may include diffusion particles 252.

Alternatively, at least one of the first dome molding unit 240 and the second dome molding unit 250 may include fluorescent materials 242.

For example, the first dome molding unit 240 may include the fluorescent materials 242, the second dome molding unit 250 may include the diffusion particles 252, and the diffusion particles 252 may be made of $TiO_2$, $SiO_2$, or the like. The diffusion particles 252 function to diffuse a light emitted from the light source unit 220 so that the light has a wider viewing angle.

Accordingly, a wider area can be uniformly illuminated even a small number of the light emitting device packages 200, and colors can be uniformly mixed. For example, as in a backlight unit described later, a color mixing effect can be improved in a structure in which a red light, a green light, and a blue light need to be mixed.

FIG. 3 is illustrated to include the fluorescent materials 242 in the first dome molding unit 240 and the diffusion particles 252 in the second dome molding unit 250. However, the diffusion particles 252 may be included in the first dome molding unit 240, and the fluorescent materials 242 may be included in the second dome molding unit 250.

Referring to FIG. 4, the light emitting device package 300 includes a plurality of protrusions 312 disposed on a substrate 310 on which a light source unit 320 is disposed.

The protrusions 312 irregularly reflect light generated by the light source unit 320 so that the light is scattered. Accordingly, light efficiency can be increased.

The protrusions 312 may be disposed to have a uniform form and a specific pattern and may be irregularly disposed.

The protrusions 312 scatter light emitted from the light source unit 320 so that the light emitting device package 300 can have a wide viewing angle and colors can be easily mixed. For example, in the case where several light emitting device packages 300 are connected to form an array, colors generated by the light emitting device packages 300 may be naturally mixed. Accordingly, the color rendering properties of color can be improved.

In some embodiments, although not shown, a plurality of grooves (not shown) or both the protrusions 312 and the grooves (not shown) may be formed in the substrate 310.

In the light emitting device package 400 of FIG. 5, a via hole 414 may be disposed in the substrate 410.

The via hole 414 may be disposed under a light source unit 420.

Meanwhile, the light source unit 420 may be a light emitting device. The light emitting device may be electrically connected to electrodes (not shown) disposed on the substrate 410.

The light source unit 420 and the electrodes (not shown) may be electrically connected by the via hole 414. The via hole 414 may also serve as a heat sink for externally dissipating heat generated in the light source unit 420.

Although not shown, the via hole 414 may be connected to a heat dissipation plate (not shown) made of a metallic material on the lower side. Since the heat dissipation plate of a metallic material with an excellent heat dissipation characteristic is connected to the via hole 414, a heat dissipation characteristic can be further improved.

Figure 6A:
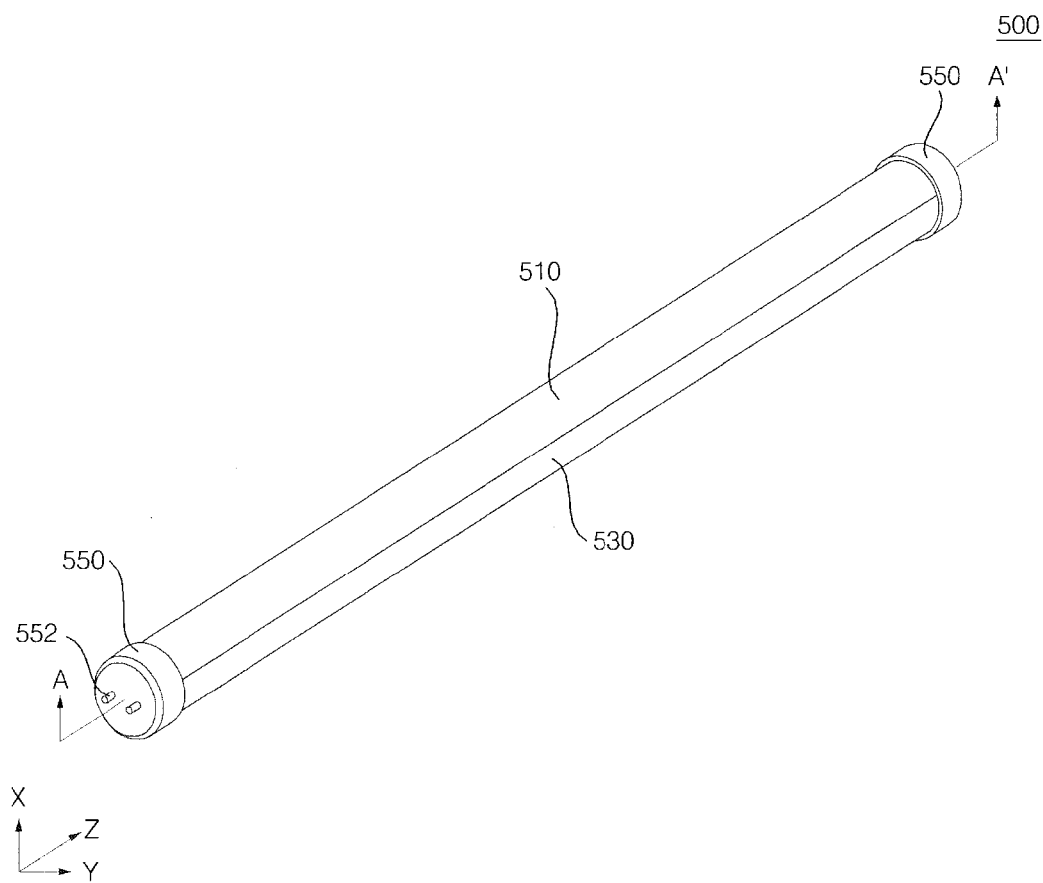
FIG. 6A is a perspective view an illumination device including a light emitting device package according to an embodiment.
Figure 6B:
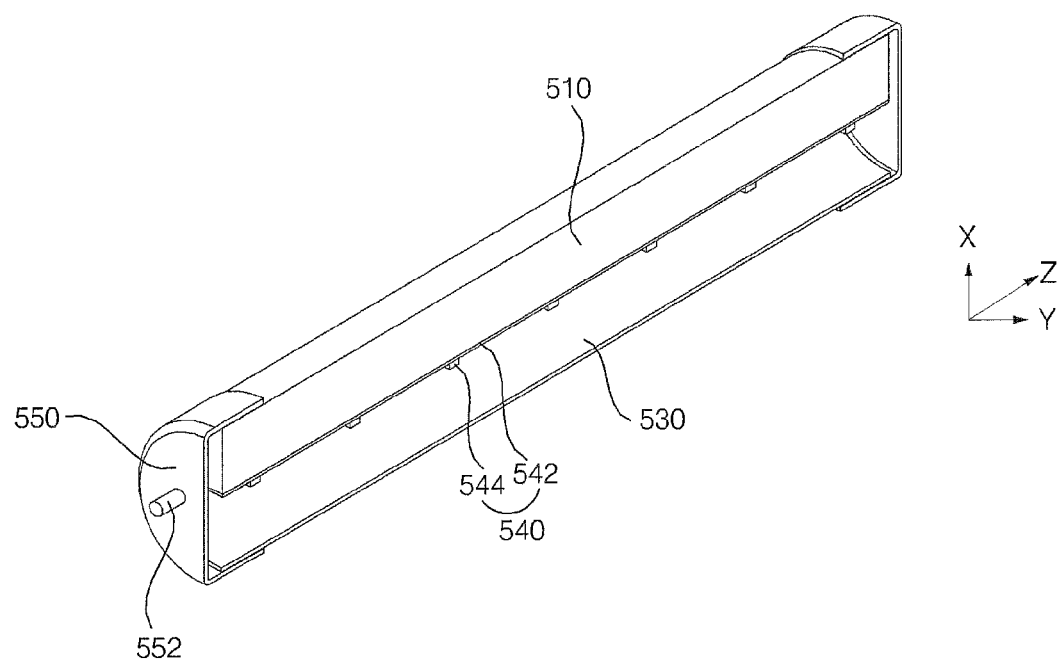
FIG. 6B is a cross sectional view taken along line A-A' in FIG. 6A.

FIG. 6A is a perspective view an illumination device including a light emitting device package according to an embodiment, and FIG. 6B is a cross sectional view taken along line A-A' in FIG. 6A.

In order to describe the shape of the illumination device according to the embodiment, it is assumed that the length direction of the illumination device is a length direction Z, a horizontal direction Y is vertical to the length direction Z, and a height direction X is vertical to the length direction Z and the horizontal direction Y.

That is, FIG. 6B is a cross sectional view in which the illumination device 500 of FIG. 6A is taken in the length direction Z and the height direction X and viewed in the horizontal direction Y.

Referring to FIGS. 6A and 6B, the illumination device 500 may include a body 510, a cover 530 fastened to the body 510, and closing caps 550 disposed on both ends of the body 510.

Light emitting device modules 540 are fastened to a lower face of the body 510. The body 510 may be disposed of a metallic material with excellent conductivity and heat diffusion effect such that heat generated by the light emitting device package 544 can be discharged externally through the upper face of the body 510.

Light emitting device packages 544 may be disposed on a printed circuit board 542 in multiple colors and in multiple columns. The light emitting device packages 544 may be spaced apart from one another at constant intervals or at various intervals in order to control brightness. For the purpose of effective heat dissipation, the printed circuit board 542 may be a metal substrate.

The light emitting device package 544 may include a light source unit (not shown), such as a light emitting device, metal oxide, and a dam unit (not shown) disposed in the periphery of the light source unit. The dam unit can reflect light generated by the light source unit, thus improving the luminance of the light emitting device package 544.

The light emitting device package 544 may further include a first dome molding unit (not shown) and a second dome molding unit (not shown) of a dome shape. In particular, the second dome molding unit has a smaller refractive index than the first dome molding unit disposed on the lower side, so that light extraction efficiency can be further improved.

The first and second molding unit of a dome shape may include diffusion particles. A plurality of protrusions may be disposed at the bottom of the light emitting device package 544 on which the light source unit is disposed. Accordingly, colors generated by the light emitting device packages 544 can be naturally mixed, thereby being capable of improving the color rendering properties of color.

The cover 530 may be disposed in a circular form in such a way as to surround the bottom surface of the body 510, but not limited thereto.

The cover 530 protects the light emitting device modules 540 from external alien substance, etc. The cover 530 may include the diffusion particles in order to prevent the dazzling of light generated in the light emitting device packages 544 and uniformly emit the light externally. A prism pattern may be disposed on at least one of the inner and outer faces of the cover 530.

Fluorescent materials may be coated on at least one of the inner and outer faces of the cover 530.

Meanwhile, since light generated by the light emitting device packages 544 is discharged externally through the cover 530, the cover 530 has to have excellent light transmittance and heat-resistant properties enough to withstand heat generated in the light emitting device package 544. The cover 530 may be made of materials, including polyethylen terephthalate (PET), polycarbonate (PC), or polymethyl methacrylate (PMMA), and so on.

The closing caps 550 are disposed on both ends of the body 510 and may be used to seal the Power Supply unit (not shown).

Furthermore, power pins 552 are disposed in the closing caps 550, and thus the illumination device 500 according to the embodiment may be used in the existing terminals without an additional device.

Figure 7:
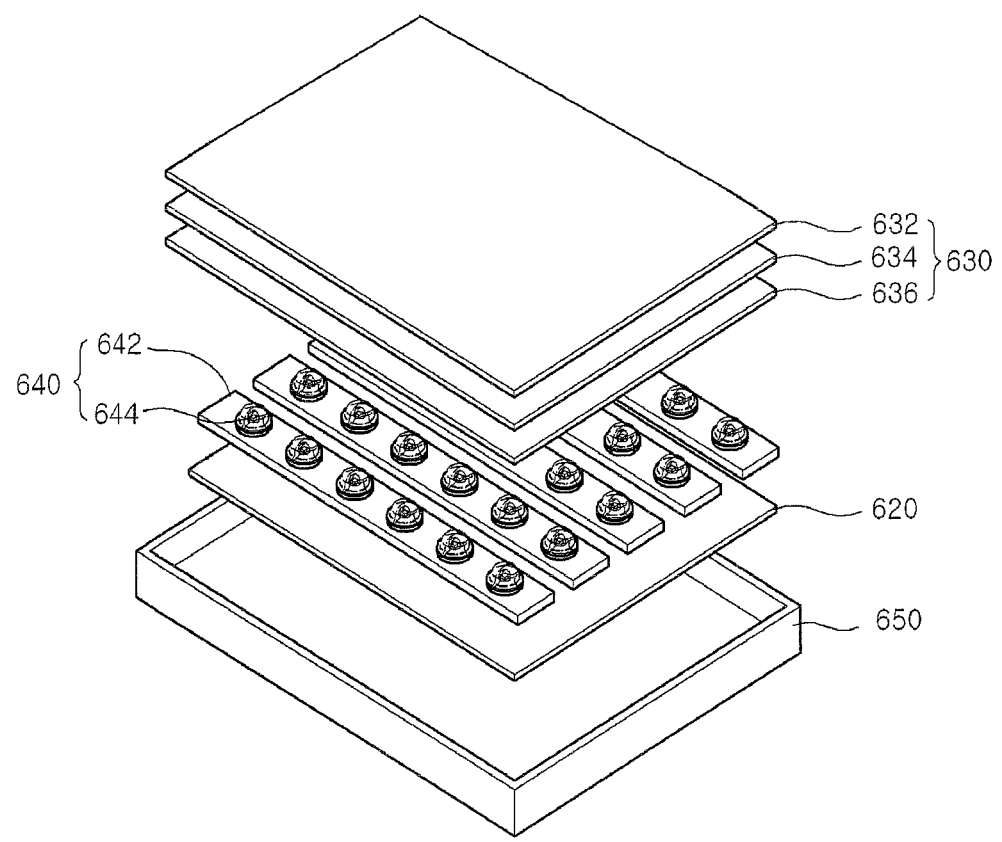
FIG. 7 is an exploded perspective view of a backlight unit including a light emitting device package according to an embodiment.

FIG. 7 is an exploded perspective view of a backlight unit including a light emitting device package according to an embodiment.

FIG. 7 shows a vertical type backlight unit. Referring to FIG. 7, the backlight unit (not shown) may include a lower reception member 650, a reflection plate 620, a plurality of light emitting device modules 640, and a plurality of optical sheets 630.

Each of the light emitting device modules 640 may include a plurality of light emitting device packages 644 and a printed circuit board 642 having the plurality of light emitting device packages 644 disposed thereon to form an array.

Each of the light emitting device packages 644 may include a first dome molding unit (not shown) which may include fluorescent materials of a dome shape and a second dome molding unit (not shown) which may include diffusion particles, thereby being capable of improving the directivity of light. In particular, since the second dome molding unit has a smaller refractive index than the first dome molding unit on the lower side, light extraction efficiency can be improved.

A plurality of protrusions may be disposed on at the bottom of the light emitting device package 644 having a light source unit (not shown) disposed thereon. Accordingly, a color mixing effect of a red light, a green light, and a blue light can be improved.

The light emitting device package 644 may further include a dam unit (not shown) disposed in the periphery of the light source unit. The dam unit includes metal oxide, such as titanium dioxide ($TiO_2$), and thus can reflect light generated by the light source unit. Accordingly, the luminance of the light emitting device package 544 can be improved.

Referring back to FIG. 7, the reflection plate 620 may be disposed of a plate having a high light reflectivity in order to reduce optical loss. The optical sheet 630 may include a luminance improvement sheet 632, a prism sheet 634, and a diffusion sheet 636.

The diffusion sheet 636 functions to direct light, incident from the light emitting device modules 640, toward the front of a liquid crystal display panel (not shown), diffuse the light so that the light has a uniform distribution in a wide range, and radiate the light to the liquid crystal display panel (not shown). The prism sheet 634 functions to change pieces of incident light with inclination, from among pieces of light incident thereon, so that the pieces of light with inclination are vertically emitted. In order to vertically change light emitted from the diffusion sheet 636, at least one prism sheet 634 may be disposed under the liquid crystal display panel (not shown). The luminance improvement sheet 632 functions to transmit light parallel to its own transmission axis, but reflect light vertical to the transmission axis.

Figure 8:
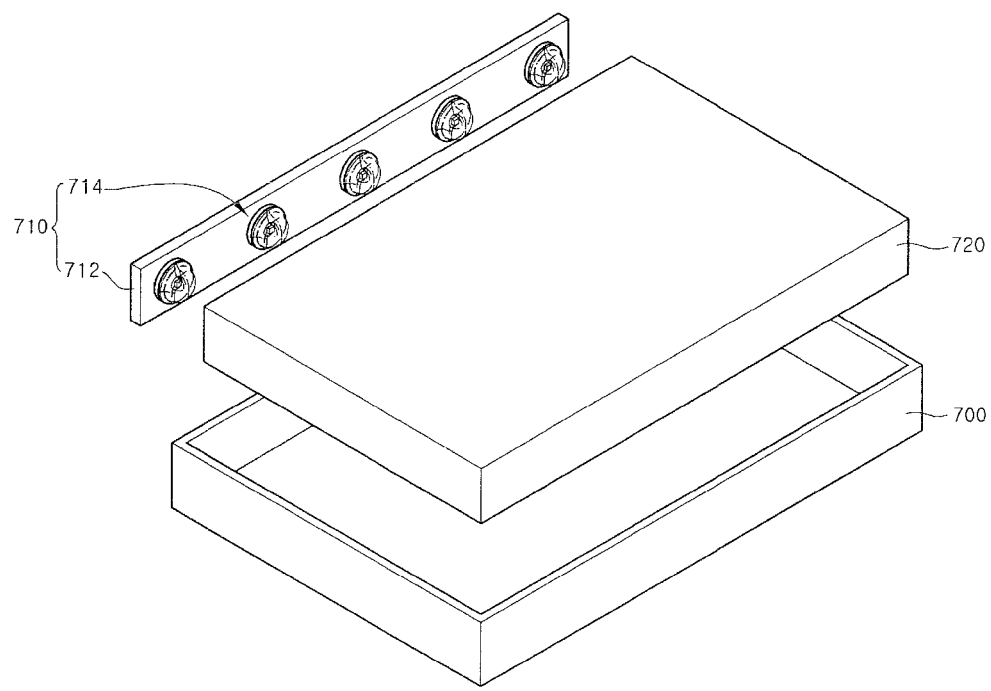
FIG. 8 is a diagram showing a backlight unit including the light emitting device package according to another embodiment.

FIG. 8 is a diagram showing a backlight unit including the light emitting device package according to another embodiment.

FIG. 8 shows an edge type backlight unit. Referring to FIG. 8, the backlight unit (not shown) may include a lower reception member 700, a light emitting device module 710 configured to generate light, a light guide plate 720 disposed adjacent to the light emitting device module 710, and a plurality of optical sheets (not shown). The plurality of optical sheets (not shown) may be disposed on the light guide plate 720. The plurality of optical sheets is the same as the plurality of optical sheets 630 shown in FIG. 7, and a detailed description thereof is omitted.

The light emitting device module 710 may have a plurality of light emitting device packages 714 and a printed circuit board 712 disposed thereon. The light emitting device packages 714 and the printed circuit board 712 form an array. A Metal Core (MC) printed circuit board or a printed circuit board made of an FR4 material may be used as the printed circuit board 712. Furthermore, the printed circuit board 712 may have not only a square plate form, but also various forms according to the structure of the backlight assembly.

A plurality of optical films (not shown) and a reflection sheet (not shown) may be disposed on the rear of the light guide plate 720. The plurality of optical films (not shown) functions to change light, generated by the light emitting device packages 714, into a form of a surface light source, provide the surface light source to a liquid crystal display panel (not shown), make uniform a luminance distribution of pieces of light provided by the light guide plate 720, and improve vertical incidence. The reflection sheet (not shown) reflects light, emitted to the rear of the light guide plate 720, to the light guide plate 720.

In some embodiments, the vertical type backlight unit shown in FIG. 7 and the edge type backlight unit shown in FIG. 8 may be combined and used.

Here, the illumination device 500 and the backlight unit (not shown) may be included in a lighting system. In addition, an apparatus for illumination, including the light emitting device package, may be included in the lighting system.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations.

The foregoing description and drawings are, accordingly, to be regarded in an illustrative rather than a restrictive sense.

What is claimed is:

1. A light emitting device package comprising:
   a substrate;
   a light source unit disposed on the substrate;
   a dam unit spaced apart from the light source unit and disposed on the substrate; and
   dome molding units disposed on the dam unit,
   wherein the dam unit including silicon resin and metal oxide,
   wherein the dome molding units comprise a first dome molding unit and a second dome molding unit formed on the first dome molding unit, and the first dome molding unit has a higher refractive index than the second dome molding unit, and
   wherein at least one of the first and second dome molding units comprises diffusion particles.

2. The light emitting device package of claim 1, wherein the metal oxide comprises titanium dioxide ($TiO_2$).

3. The light emitting device package of claim 1, wherein the dam unit has a height of 30 μm to 300 μm.

4. The light emitting device package of claim 1, wherein a distance between the light source unit and the dam unit is 50 μm to 1000 μm.

5. The light emitting device package of claim 1, wherein at least one of the first and second dome molding units comprises fluorescent materials.

6. The light emitting device package of claim 1, further comprising a plurality of protrusions disposed on the substrate.

7. The light emitting device package of claim 1, wherein the dam unit has a circular or polygonal shape.

8. The light emitting device package of claim 1, wherein the substrate comprises a hole formed under the light source unit.

9. The light-emitting element package of claim 1, wherein the metal oxide is used in an amount of 5 wt % to 150 wt % based on a total amount of the silicon resin.

10. A light-emitting element package, comprising:
    a substrate;
    a light source unit mounted on the substrate; and
    a dam unit spaced apart from the light source unit and formed on the substrate,
    wherein the dam unit comprises silicon resin and metal oxide, wherein the dam unit is disposed stepwise in a direction of the light source unit.

11. The light-emitting element package of claim 10, wherein the metal oxide comprises titanium dioxide (TiO2).

12. The light-emitting element package of claim 10, further comprising dome molding units disposed on the dam unit.

13. The light-emitting element package of claim 12, wherein:
    the dome molding units comprise a first dome molding unit and a second dome molding unit formed on the first dome molding unit, and
    the first dome molding unit has a higher refractive index than the second dome molding unit.

14. The light-emitting element package of claim 13, wherein at least one of the first and second dome molding units comprises fluorescent materials.

15. The light-emitting element package of claim 13, wherein at least one of the first and second dome molding units comprises diffusion particles.

16. The light-emitting element package of claim 10, further comprising a plurality of protrusions formed on the substrate.

17. The light-emitting element package of claim 10, wherein the metal oxide is used in an amount of 5 wt % to 150 wt % based on a total amount of the silicon resin.

* * * * *